United States Patent
Yang et al.

(10) Patent No.: US 6,734,028 B1
(45) Date of Patent: May 11, 2004

(54) METHOD OF DETECTING SHALLOW TRENCH ISOLATION CORNER THINNING BY ELECTRICAL STRESS

(75) Inventors: Tien-Chun Yang, San Jose, CA (US); Nian Yang, San Jose, CA (US); Hyeon-Seag Kim, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 57 days.

(21) Appl. No.: 10/113,152

(22) Filed: Mar. 28, 2002

(51) Int. Cl.$^7$ .............................................. H01L 21/66
(52) U.S. Cl. ........................... 438/17; 438/18; 257/48; 700/110; 700/121
(58) Field of Search .............................. 438/14, 17, 18; 257/48; 700/110, 121

(56) References Cited

U.S. PATENT DOCUMENTS 6,040,199 A * 3/2000 Kimura et al. ................ 438/17

* cited by examiner

Primary Examiner—Evan Pert
Assistant Examiner—Asok Kumar Sarkar (57) ABSTRACT

A method and apparatus for testing semiconductors comprising shallow trench isolation (STI) edge structures. An edge intensive shallow trench isolation structure (500) is coupled to a voltage source (310) and a current versus voltage profile is recorded. A planar structure (600) on the same wafer is coupled to a voltage source and a current versus voltage profile is recorded. An electrical stress is applied to both structures. Additional current profiles of each structure are obtained after the electrical stress. A comparison of difference current profiles obtained for the two types of structures may indicate the presence and/or the extent of STI corner effects. More specifically, a value for a normalized gate current difference for an STI edge intensive structure (500) greater than normalized gate current difference of a planar structure (600) is indicative of an increased rate of electron trapping in STI corners, which may indicate that the STI corners are too thin. In this novel manner, STI corner thickness may be observed in a non-destructive, electrical test process, resulting in higher quality and greater reliability of semiconductors using STI processes.

16 Claims, 12 Drawing Sheets

Poly gate 210

Tox
220

240 substrate

METHOD OF DETECTING SHALLOW TRENCH ISOLATION CORNER THINNING BY ELECTRICAL STRESS

TECHNICAL FIELD

Embodiments of the present invention relate to semiconductor process control, reliability and testing. More particularly, embodiments of the present invention provide a method of detecting shallow trench isolation corner thinning by electrical stress.

BACKGROUND ART

For reasons of cost improvement, increasing speed of operation, power consumption decreases and other well known reasons, the semiconductor industry is pushing the geometry of integrated circuits to ever smaller sizes A typical size of the smallest feature on a chip is, for example, 0.18 $\mu$m. As semiconductors are designed for this and smaller geometries, the once dominant isolation technique known as LOCOS, Local-Oxidation of Silicon, is becoming less prominent, and a newer technique known as Shallow Trench Isolation, STI, is becoming the preferred method of isolation.

When compared to LOCOS, STI generally requires a much smaller area to isolate transistors while offering superior latch-up immunity, smaller channel width encroachment and better planarity. LOCOS is generally a very high temperature process, performed at temperatures of approximately 1,000 degrees C. STI generally is processed at significantly lower temperatures, typically around 500 degrees C. LOCOS commonly suffers from two well known characteristics known as bird's beak and encroachment, which do not occur with STI. Further, by separating two active devices by a trench as with STI, the electrical field lines have to travel a longer distance and change direction twice, so they are considerably weakened. Therefore, trenches of sub-micrometer dimensions are adequate for isolation to prevent punch-through and latch-up phenomena Consequently, STI structures and processes allow for the required isolation at smaller semiconductor process geometries and with smaller structures than does LOCOS.

Unfortunately, STI is generally a more difficult process to control. To some extent, this results from the smaller size and thinner layers of the structures. As a result, process control, and the corollary quality inspections are of critical importance in an STI process.

The well known, industry-wide standard inspection method is to examine sections of a semiconductor wafer with a tunneling electron microscope, TEM, to measure the thickness of the various layers, for example, polysilicon, oxide, metalization, etc.

Unfortunately, such use of the TEM has many undesirable drawbacks. Because it is a destructive test, it can only be applied to a sample of a batch of wafers. Further, it is well known in the industry that process quality and defects vary across a single wafer. This is especially true as the industry moves toward larger wafer sizes, for example, 8 and 12 inch wafers. A TEM inspection can physically only be made at a few points in a wafer. It is also a time consuming process to section, prepare and inspect samples via TEM. As an unfortunate result, the quality of the STI generally can only be examined in a rather limited fashion at a few sample points on very few sample wafers. Consequently, it is difficult to gain a thorough understanding of the process, and it is commercially infeasible to test all wafers for process quality.

What is highly sought in the industry, then, is a fast, non-destructive method of testing semiconductors constructed with STI, particularly a method of measuring the oxide thickness.

DISCLOSURE OF THE INVENTION

A method and apparatus for testing semiconductors comprising shallow trench isolation (STI) edge structures are disclosed. An edge intensive shallow trench isolation structure is coupled to a voltage source and a current profile is recorded. A planar structure on the same wafer is coupled to a voltage source and a current profile is recorded. An electrical stress is applied to both structures. Additional current profiles of each structure are obtained after the electrical stress. A comparison of difference current profiles obtained for the two types of structures may indicate the presence and/or the extent of STI corner effects. More specifically, a value for a normalized gate current difference for an STI edge intensive structure greater than normalized gate current difference of a planar structure is indicative of an increased rate of electron trapping in STI corners, which may indicate that the STI corners are too thin. In this novel manner, STI corner thickness may be observed in a non-destructive, electrical test process, resulting in higher quality and greater reliability of semiconductors using STI processes.

BEST MODE FOR CARRYING OUT THE INVENTION

In the following detailed description of the present invention, method of detecting shallow trench isolation corner thinning by electrical stress, numerous specific details are set forth in order to provide a thorough understanding of the present invention. However, it will be recognized by one skilled in the art that the present invention may be practiced without these specific details or with equivalents thereof. In other instances, well-known methods, procedures, components, and circuits have not been described in detail so as not to unnecessarily obscure aspects of the present invention.

METHOD OF DETECTING SHALLOW TRENCH ISOLATION CORNER THINNING BY ELECTRICAL STRESS

Embodiments of the present invention are described in the context of semiconductor processing and testing. However, it is appreciated that embodiments of the present invention may be utilized in other areas of process quality inspection.

Figure 1:
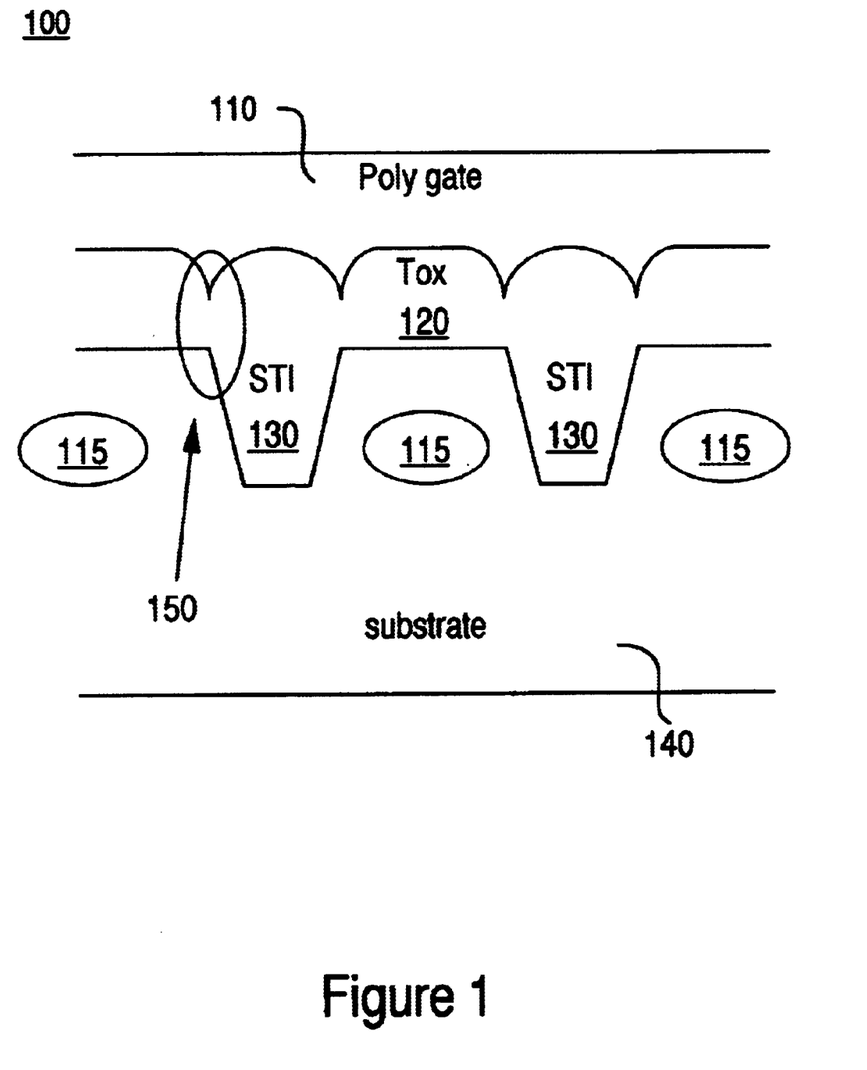
FIG. 1 is an illustration of a shallow trench isolation edge capacitor, according to an embodiment of the present invention.

FIG. 1 is an illustration of a cross section of a shallow trench isolation, or STI, edge capacitor 100, according to an embodiment of the present invention. Structure 100 may comprise a substrate 140, which may be silicon, active areas 115, shallow trench isolation regions 130, a layer of gate oxide 120 and a polysilicon gate layer 110.

Region 150 of FIG. 1 is referred to as an "STI corner." As the filling oxide 120 and 130 are deposited, they may tend to follow or reflect features of the underlying structures, for example substrate 140. In particular, oxide 120 may form a corner in region 150 substantially "over" or above a corner of the substrate 140 which is part of the shallow trench isolation well 130.

It is well known in the industry that such an STI corner may result in oxide in region 150 being too thin for proper function of the semiconductor device. Thinned corners can enhance tunneling current and therefore degrade reliability.

The well known, industry-wide standard method to examine oxide layer 120, for example in region 150, for the presence of an STI cornering effect is to examine sections of a semiconductor wafer with a tunneling electron microscope, or TEM.

Unfortunately, such use of the TEM has many undesirable drawbacks. Because it is a destructive test, it can only be applied to a sample of a batch of wafers. Further, it is well known in the industry that process quality and defects vary across a single wafer. This is especially true as the industry moves toward larger wafer sizes, for example, 8 and 12 inch wafers. A TEM inspection can physically only be made at a few points in a wafer. It is also a time consuming process to section, prepare and inspect samples via TEM. As an unfortunate result, the quality of the STI generally can only be examined in a rather limited fashion at a few sample points on very few sample wafers. Consequently, it is difficult to gain a thorough understanding of the process, and it is commercially infeasible to test all wafers for process quality.

Figure 2:
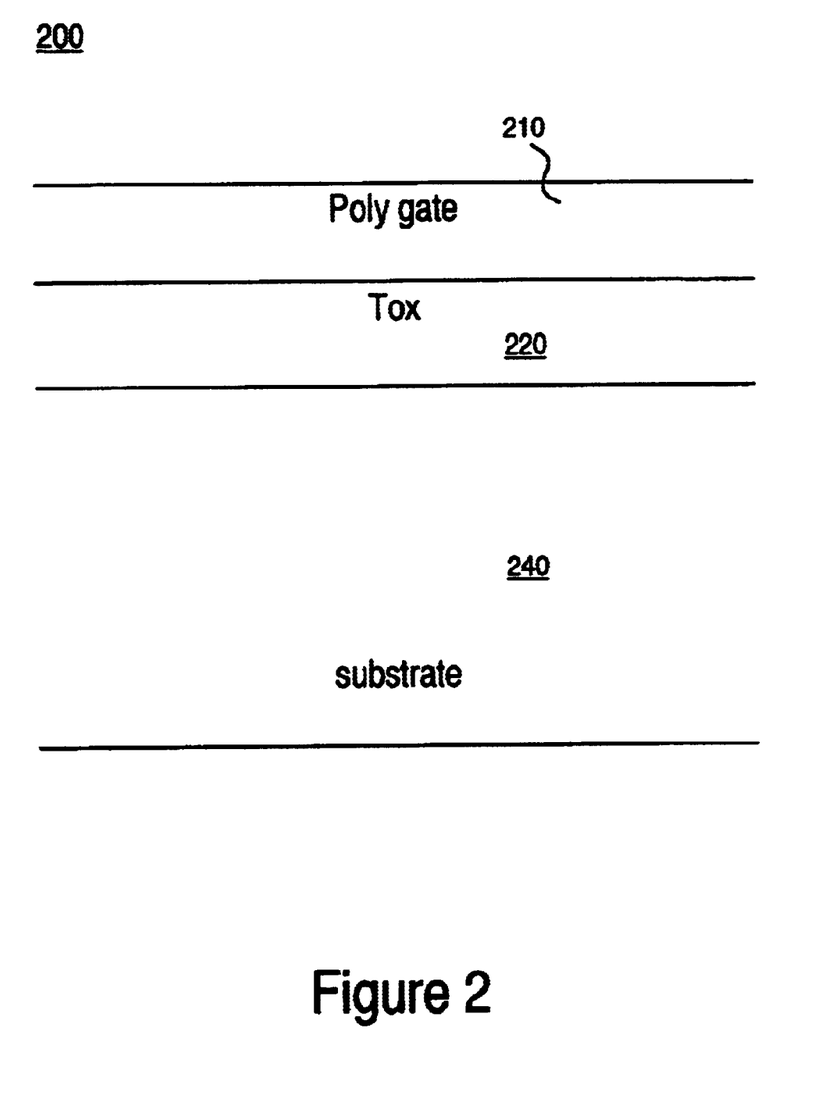
FIG. 2 is an illustration of a lumped capacitor, according to an embodiment of the present invention.

According to an embodiment of the present invention, a lumped capacitor structure is constructed as shown in cross section 200 of FIG. 2. Lumped capacitor 200 may comprise a substrate 240, a polysilicon gate 210 and a substantially flat or planar oxide layer 220.

Figure 3:
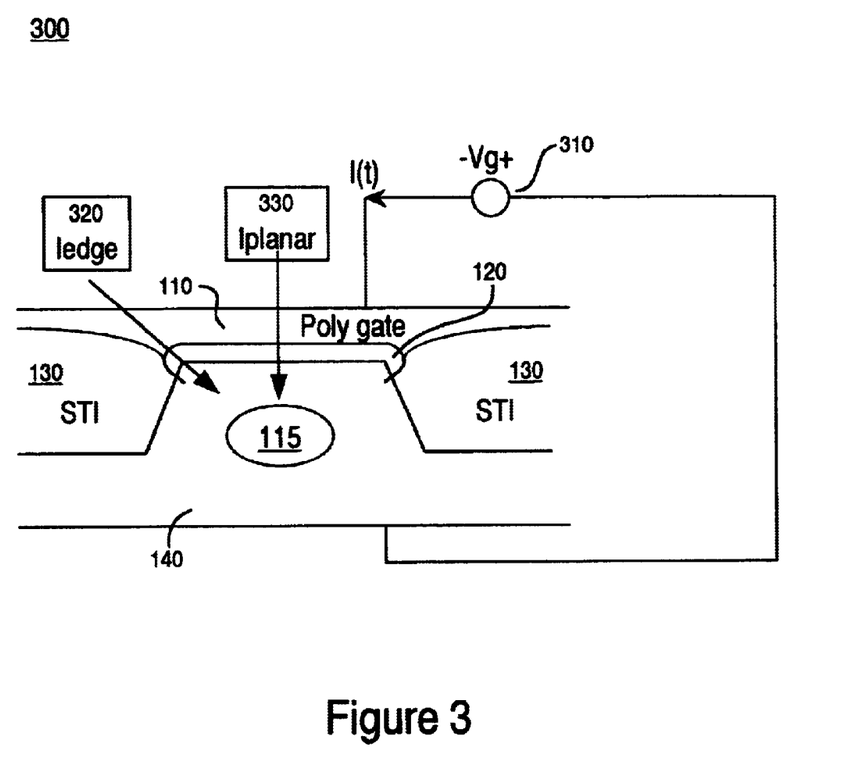
FIG. 3 shows an arrangement comprising a portion of an STI capacitor structure with a voltage applied between the gate and the substrate, according to an embodiment of the present invention.

FIG. 3 shows an arrangement 300 comprising a portion of STI capacitor structure 100 with a voltage 310 applied between the gate 110 and the substrate 140, according to an embodiment of the present invention. In response to applied voltage 310, a current "I" may flow. Current I is comprised of a planar component, "Iplanar" 330 and an edge component, "Iedge" 320 such that the total current, Itotal is equal to the sum of Iplanar plus Iedge.

Employing well known techniques, information of total current versus voltage, known as an "I-V curve" is collected for the arrangement 300. In a similar manner, a voltage is applied between poly gate 210 and substrate 240 of lumped capacitor 200 of FIG. 2, and current information (I-V) is collected for this arrangement (not shown).

According to an embodiment of the present invention, it is preferred to collect a first set of I-V information as the first application of voltage to a device.

Subsequent to collecting such I-V information, an electrical stress is applied to both the STI and planar structures. The voltage used for the stress is chosen to approach, but not meet or exceed, a dielectric breakdown voltage of an oxide layer. Acceptable experimental results have been obtained with voltages in the range of about 80% to 90% of such breakdown voltage. Further, the stressing voltage is applied for a period of time, generally between 5 and 60 seconds. From experimentation, 5 seconds is approximately the lower limit are which beneficial stressing occurs, and around 60 seconds the testing process may become commercially infeasible due to the total time required for multiple passes. It is to be appreciated that embodiments of the present invention are well suited to stress voltages and times outside of these guidelines.

After applying the electrical stress, another set of I-V information is obtained for both structures. For each structure, the first set of I-V information is subtracted from the subsequent, or post-stress set of I-V information to obtain a difference in current versus voltage for the two conditions.

To normalize the data in the difference I-V curves, the difference current as a function of voltage is divided by a current versus voltage curve obtained as the first application of voltage or "fresh" current, herein "Ifresh,"

$$\Delta Inormal = \Delta I / Ifresh.$$

It has been found to aid understanding to present the normalized differences as percentages.

According to an embodiment of the present invention, the edge component current, Iedge 320, may vary greatly according to the corner effect. For example, if the corner is thin, edge current 320 may increase, resulting in an increased total current. Likewise, if the edge is thick, then edge current 320 may be decreased or negligible, resulting in a decreased total current.

An increased current through a structure may result in increased charge trapping within elements of the structure. The novel method of measuring a difference in current before and after electrical stress has been found to produce an accurate reflection of the electric field of the structure.

When compared with similar I-V difference measurements of a planar structure on the same wafer, a larger difference between pre- and post-stress currents for an STI structure indicates a higher electric field and thinner corners. Correspondingly, a smaller difference indicates thicker corners.

FIGS. 4A through 4D illustrate a family of graphs of normalized difference current (in percentage) versus voltage of a planar structure for different stressing voltages, according to embodiments of the present invention.

Figure 4A:
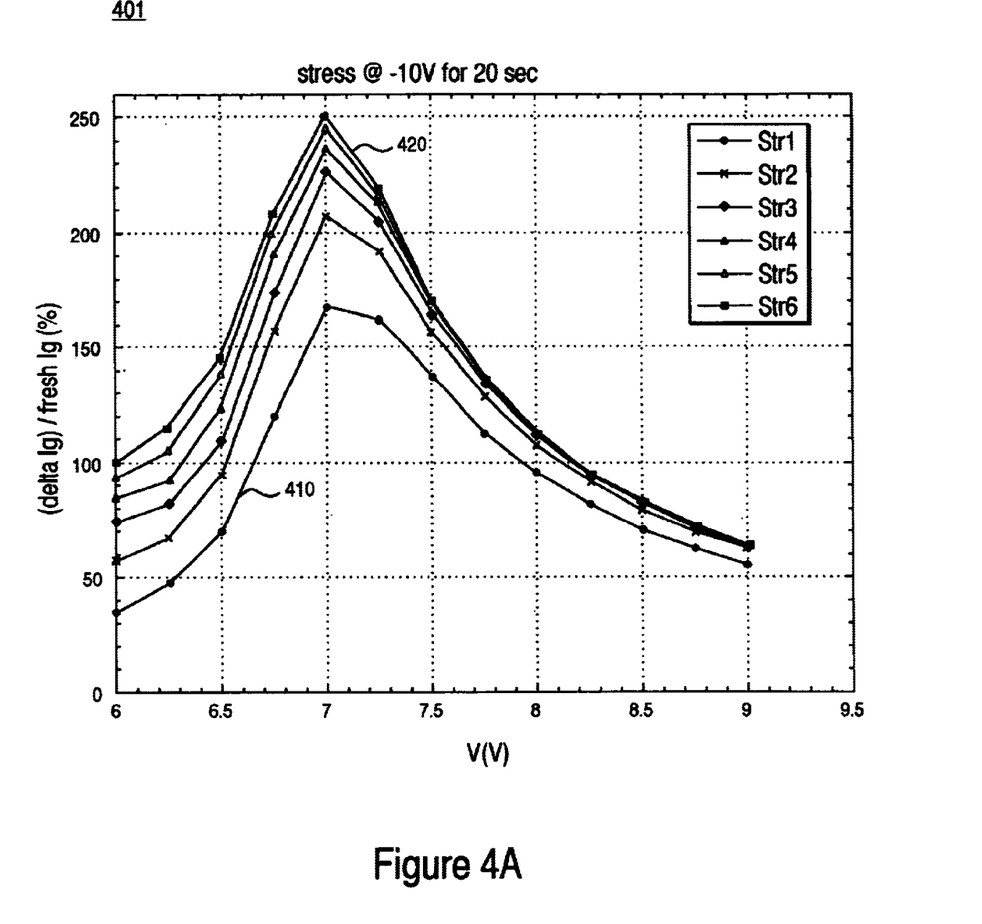
FIGS. 4A, 4B, 4C and 4D illustrate a family of graphs of normalized difference current versus voltage of a planar structure for different stressing voltages, according to embodiments of the present invention.

FIG. 4A illustrates a graph 401 of normalized difference current (in percentage) versus voltage of a planar structure, according to an embodiment of the present invention. As described above, a voltage sweep was applied to a planar structure, and information was collected to construct an I-V curve. Subsequently, a stress voltage, in this case −10 volts, was applied for a period of 20 seconds. Then, a voltage sweep was applied to a planar structure, and another set of information was collected to construct another I-V curve.

Curve 410 of FIG. 4A shows the difference between the two I-V curves, normalized by the first I-V curve, as a percentage.

Graph 401 also shows normalized difference curves for five additional applications of a stressing voltage. Curve 420 of FIG. 4A shows a normalized difference between I–V curves before and after a sixth application of an electrical stress.

Figure 4B:
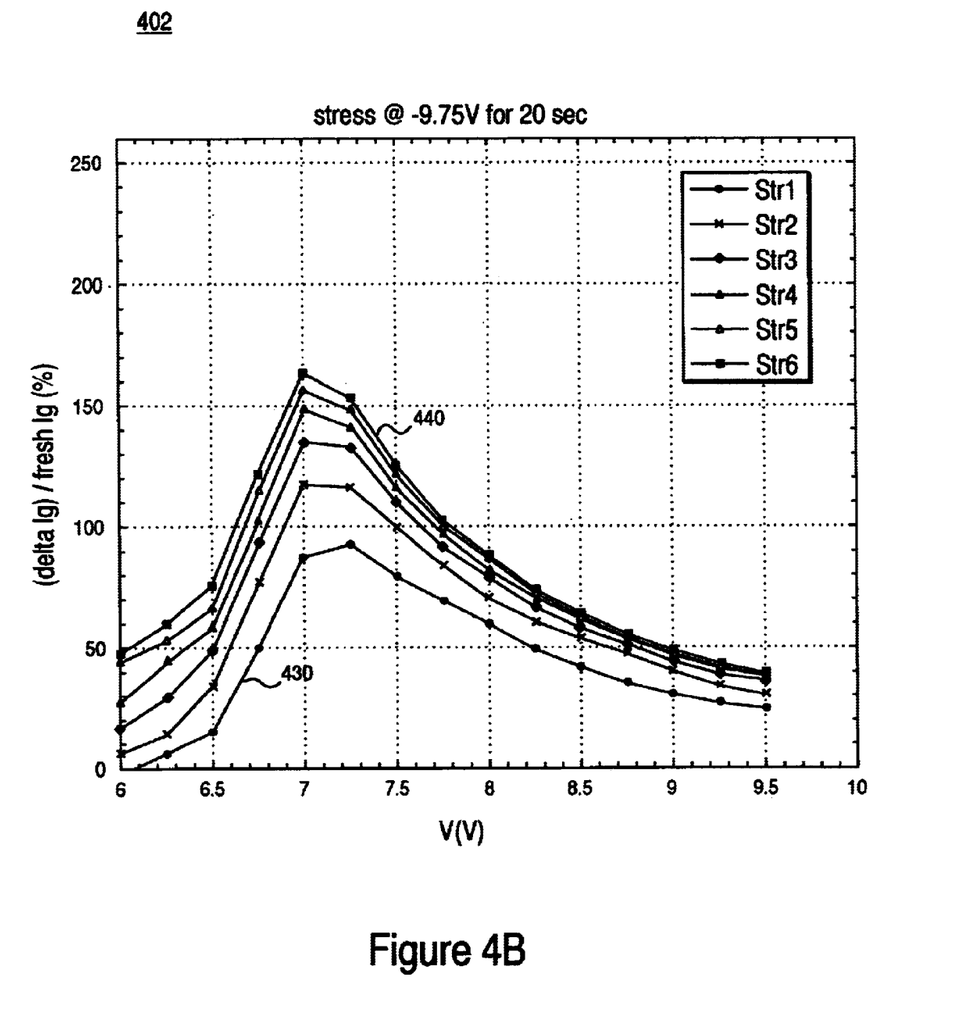

FIG. 4B illustrates a graph 402 of normalized difference current (in percentage) versus voltage of a planar structure, according to an embodiment of the present invention. As described above, a voltage sweep was applied to a planar structure, and information was collected to construct an I–V curve. Subsequently, a stress voltage, in this case −9.75 volts, was applied for a period of 20 seconds. Then, a voltage sweep was applied to a planar structure, and another set of information was collected to construct another I–V curve.

Curve 430 of FIG. 4B shows the difference between the two I–V curves, normalized by the first I–V curve, as a percentage.

Graph 402 also shows normalized difference curves for five additional applications of a stressing voltage. Curve 440 of FIG. 4B shows a normalized difference between I–V curves before and after a sixth application of an electrical stress.

Figure 4C:
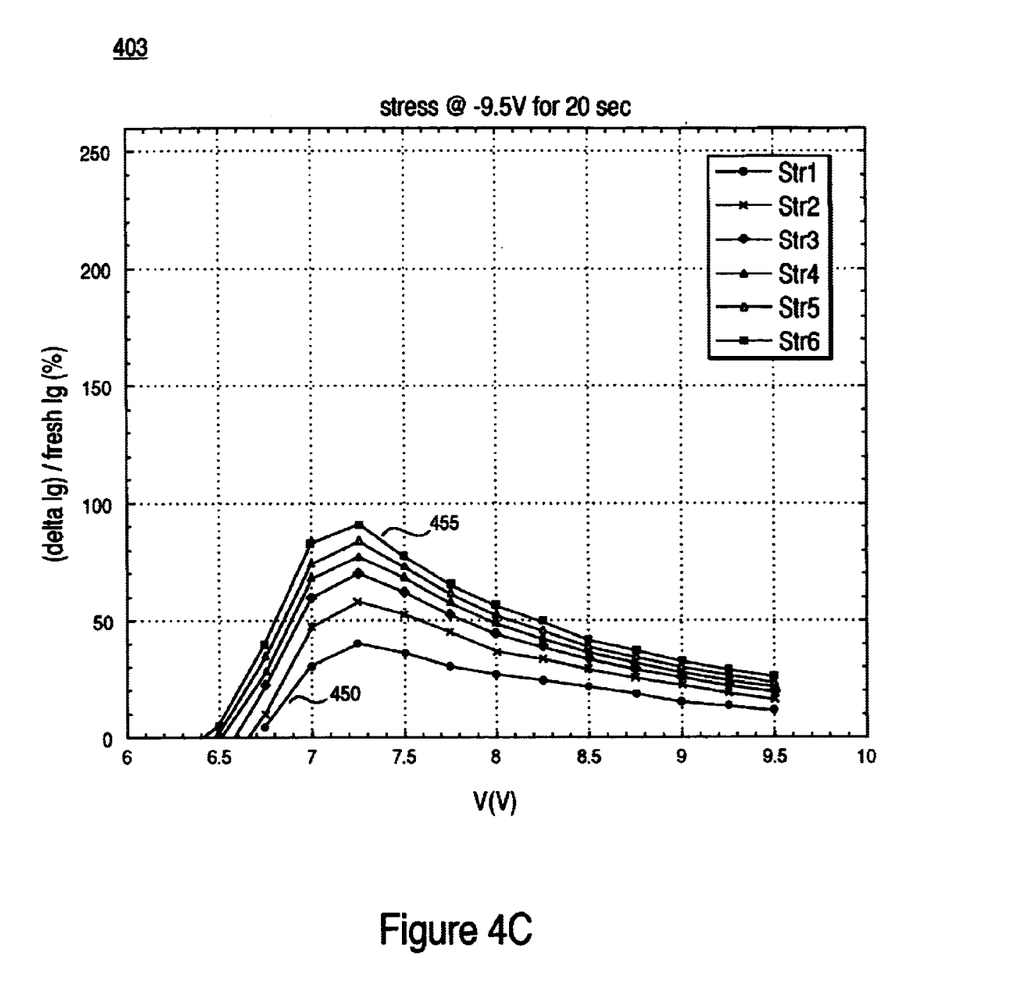

FIG. 4C illustrates a graph 403 of normalized difference current (in percentage) versus voltage of a planar structure, according to an embodiment of the present invention. As described above, a voltage sweep was applied to a planar structure and information was collected to construct an I–V curve. Subsequently, a stress voltage, in this case −9.5 volts, was applied for a period of 20 seconds. Then, a voltage sweep was applied to a planar structure, and another set of information was collected to construct another I–V curve.

Curve 450 of FIG. 4C shows the difference between the two I–V curves, normalized by the first I–V curve, as a percentage.

Graph 403 also shows normalized difference curves for five additional applications of a stressing voltage. Curve 455 of FIG. 4C shows a normalized difference between I–V curves before and after a sixth application of an electrical stress.

Figure 4D:
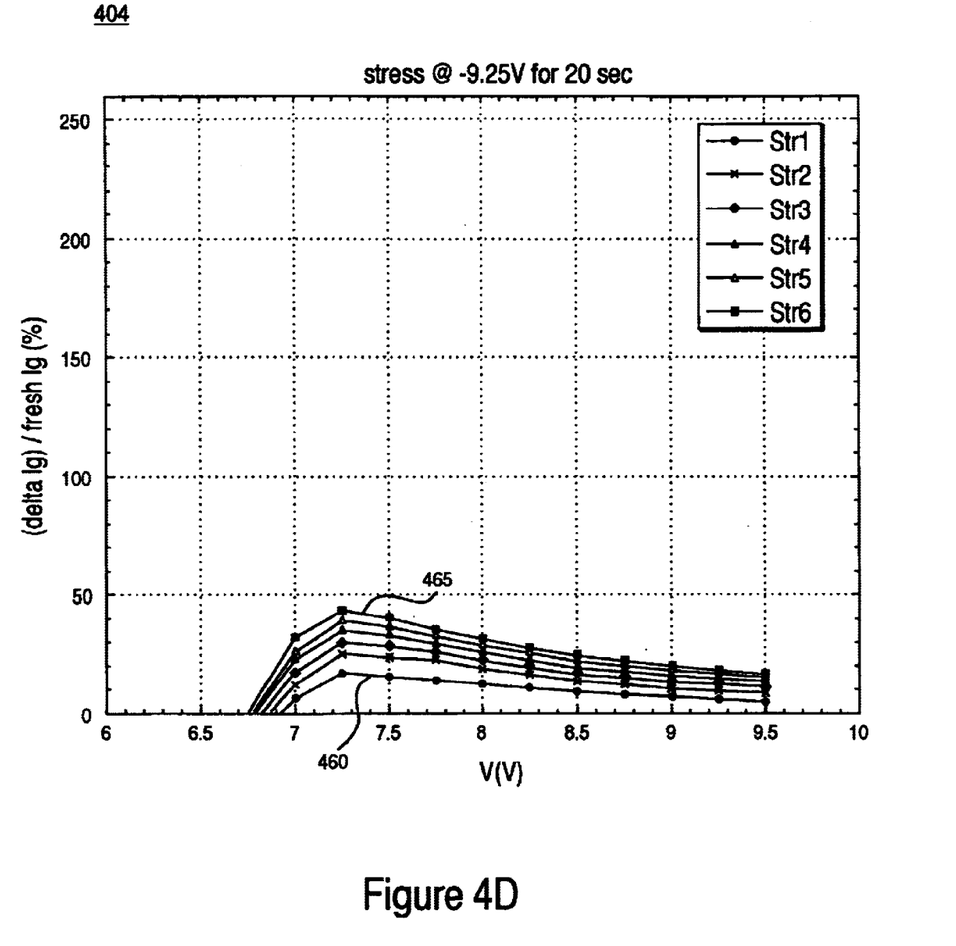

FIG. 4D illustrates a graph 404 of normalized difference current (in percentage) versus voltage of a planar structure, according to an embodiment of the present invention. As described above, a voltage sweep was applied to a planar structure, and information was collected to construct an I–V curve. Subsequently, a stress voltage, in this case 9.25 volts, was applied for a period of 20 seconds. Then, a voltage sweep was applied to a planar structure, and another set of information was collected to construct another I–V curve.

Curve 460 of FIG. 4D shows the difference between the two I–V curves, normalized by the first I–V curve, as a percentage.

Graph 404 also shows normalized difference curves for five additional applications of a stressing voltage. Curve 465 of FIG. 4D shows a normalized difference between I–V curves before and after a sixth application of an electrical stress.

In general, there is a substantial difference between curves corresponding to the first few stress events, for example between the first and second applications of electrical stress. However, there is less difference between curves for the last few stress events, for example between the fifth and sixth applications of electrical stress. Consequently, it is desirable to perform more than one stress and collection of current information; more than about six stressings contributes little or no additional information.

A comparison of graphs 401 with graphs 402 through 404 shows that higher stressing voltages generally produce greater normalized differences. Consequently, higher stress voltages are generally advantageous. However, stress voltages should not cause dielectric breakdown of an oxide layer in the semiconductor structure.

Referring once again to FIGS. 1 and 2, oxide layer 120 of FIG. 1 and oxide layer 220 of FIG. 2 may advantageously be constructed of nominally the same thickness, according to an embodiment of the present invention. When so constructed, the planar component of current, Iplanar 330 of FIG. 3 may generally be similar to the currant though lumped capacitor 200 when excited by a voltage source. In general, STI edge effects, either thinning or thickening may account for differences in normalized current between structure 100 and structure 200.

Figure 8:
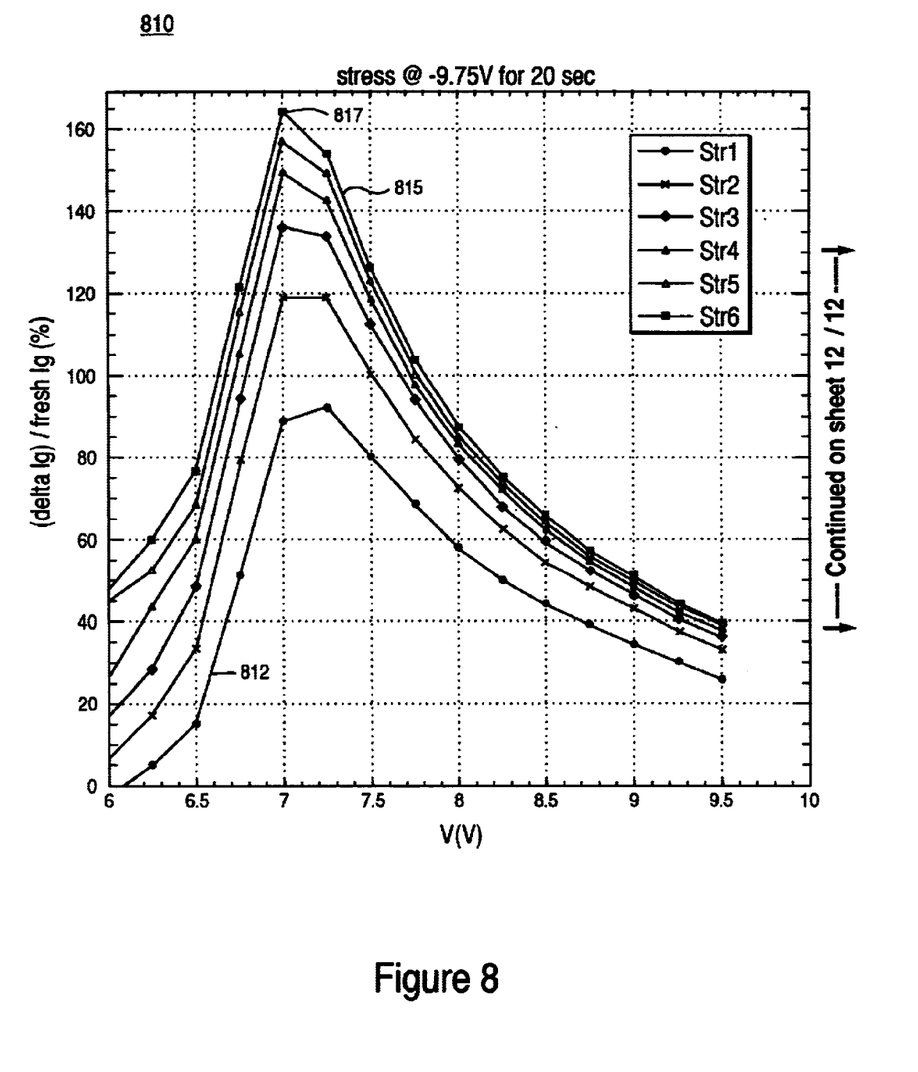
FIG. 8 shows a graph illustrating plots of experimental results of normalized difference current versus voltage for an edge intensive STI structure and a substantially planar structure, according to an embodiment of the present invention.

Further, thinner STI corners are affected by the stressing voltage to a greater degree, and consequently trap more charge and show greater normalized differences between pre- and post-stress I–V curves. For example, Graph 820 of FIG. 8 shows a graph similar to graph 401 of FIG. 4A, which was constructed for a structure with STI corners, for example STI edge intensive structure 500 of FIG. 5. If both structures are on the same semiconductor wafer, a greater value for normalized difference current for structure 500 compared with a planar structure, for example structure 600 of FIG. 6, will generally indicate STI corner thinning. Correspondingly, a greater value for an STI structure compared with a planar structure will indicate thicker corners.

According to an embodiment of the present invention, test-specific structures are included on a semiconductor wafer. It is appreciated that such structures may be located in ways and locations so as to minimize the impact of loss of revenue-generating wafer area, as well as to maximize the effectiveness and coverage of the test structures.

Figure 5:
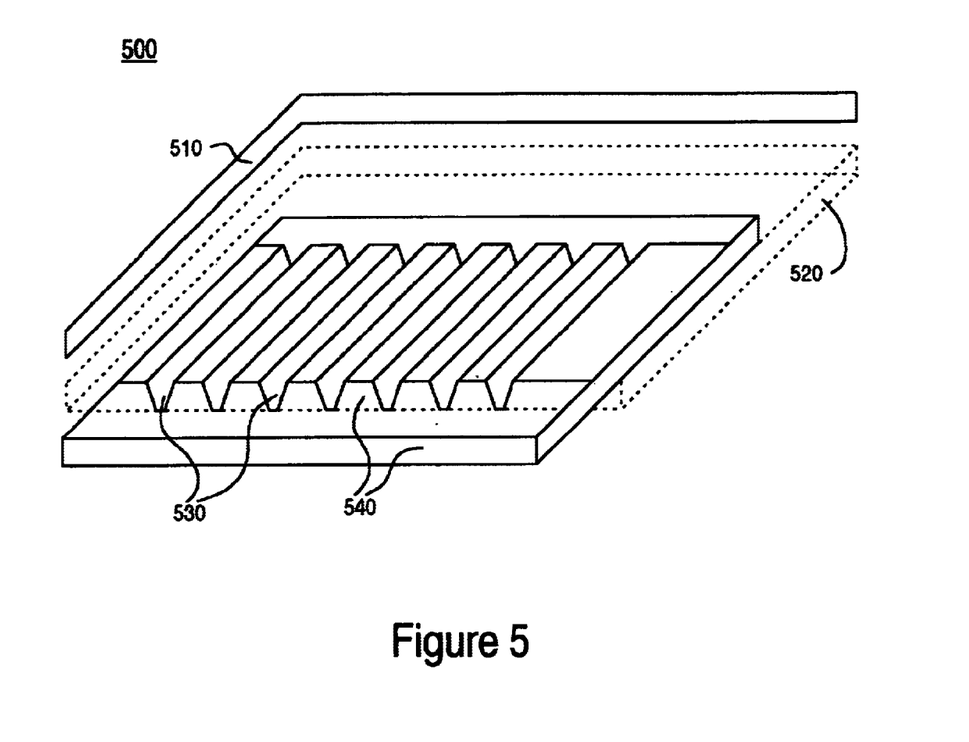
FIG. 5 depicts an STI edge intensive semiconductor structure, according to an embodiment of the present invention.

FIG. 5 depicts an STI edge intensive semiconductor structure 500, according to an embodiment of the present invention. FIG. 5 is a perspective view of a plurality of structures similar to structure 100 of FIG. 1.

Structure 500 includes a substrate 540, a plurality of shallow trench isolation "wells" 530, an oxide layer 520 and a polysilicon gate layer 510. These structures are substantially vertically aligned. It is appreciated that structure 500 may have more or less layers corresponding to the general layer arrangement of the semiconductor wafer containing structure 500. In general, oxide 520 fills STI trench 530, sometimes also known as a well.

Figure 6:
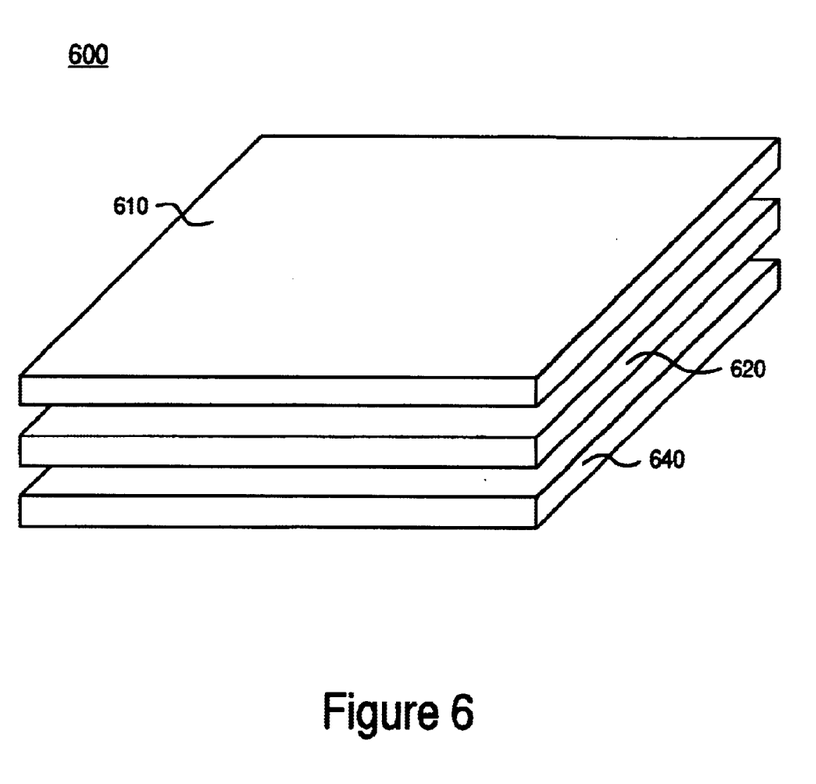
FIG. 6 depicts a lumped capacitor semiconductor structure, according to an embodiment of the present invention.

FIG. 6 depicts a lumped capacitor semiconductor structure 600, according to an embodiment of the present invention. FIG. 6 is a perspective view of an extended structure similar to structure 200 of FIG. 2. Structure 600 includes a substrate layer 640, an oxide layer 620 and a gate layer 610. It is appreciated that structure 600 may have more or less layers corresponding to the general layer arrangement of the semiconductor wafer containing structure 600.

Figure 7:
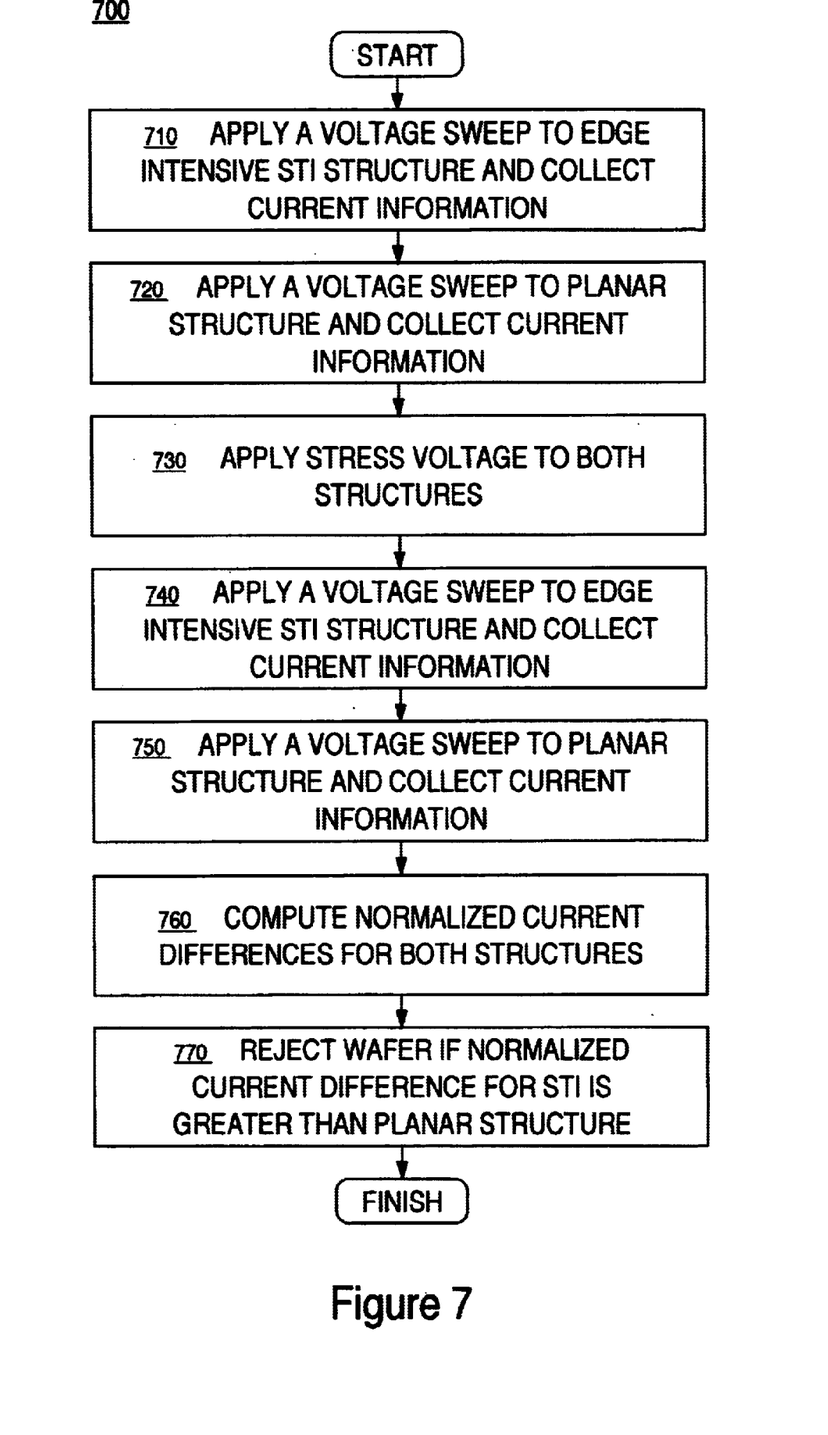
FIG. 7 illustrates a flow diagram of a method for testing semiconductors containing shallow trench isolation, according to an embodiment of the present invention.

FIG. 7 illustrates a flow diagram of a method 700 for testing semiconductors containing shallow trench isolation, according to an embodiment of the present invention.

In step 710, a ramping voltage is applied between a gate and a substrate of an edge intensive shallow trench isolation structure, for example structure 500. At a plurality of voltages, current information is collected. This step is widely known as generating an "I–V" (for current versus voltage) curve. In step 720, a similar process is performed on a planar structure, for example structure 600, and an I–V curve is generated. It is appreciated that embodiments of the present invention are well suited to a variety of means for collecting such I–V data and that it is not necessary to actually construct visual plots of such information.

In step 730, a constant voltage is applied between a gate and a substrate of both structures, for example edge intensive STI structure 600 and planar structure 500. Arrangement 300 of FIG. 3 presents an example of the application of this voltage. This voltage application is known as a stress voltage. The voltage used for the stress is chosen to approach, but not meet or exceed, a dielectric breakdown voltage of an oxide layer of the semiconductor. Acceptable experimental results have been obtained with voltages in the range of 80% to 90% of such breakdown voltage. Further, the stressing voltage is applied for a specific period of time, generally between 5 and 60 seconds. From experimentation, 5 seconds is approximately the lower limit are which beneficial stressing occurs, and around 60 seconds the testing process may become commercially infeasible due to the total time required for multiple passes. It is to be appreciated that embodiments of the present invention are well suited to stress voltages and times outside of these guidelines.

In step 740, step 710 is repeated. The information collected is saved separately from the information collected in step 710, for example in a different area of a computer readable media Likewise, in step 750, step 720 is repeated, again preserving both sets of information.

In this novel manner, STI and planar structures are stressed, and information is collected which measures a change in behavior of the semiconductor structures due to the stressing. From this information, the presence or absence of STI corner effects may be inferred.

In optional step 760, a difference in pre- and post-stress currents for each structure are computed. To normalize the data in the difference I–V curves, the difference current as a function of voltage is divided by a current versus voltage curve obtained as the first application of voltage or "fresh" current, $$\Delta I_{normal} = \Delta I / I_{fresh}.$$

It has been found to aid understanding to present the normalized differences as percentages.

In optional step 770, a wafer containing structures 500 and 600 is rejected if a plot of normalized difference current versus voltage for structure 500 is greater and/or is generally "above" the corresponding plot of normalized difference current versus voltage for structure 600. This relationship may indicate that STI corners are too thin for desired levels of reliability. It is appreciated that other comparisons between normalized difference current versus voltage plots are well suited to embodiments of the present invention For example, a wafer may be rejected if the plot for structure 500 is more than 110% of the plot of structure 600.

It is to be appreciated that embodiments of the present invention are well suited to well known methods of representing normalized difference current versus voltage information, and that it is not necessary to physically construct a plot or graph to practice embodiments of the present invention. Visual plots are well suited to describe embodiments of the present invention to those skilled in the art. However, other well known forms of information storage and comparison, including direct numerical calculation of values and/or automatic comparisons by computer, are well suited to embodiments of the present invention.

According to an embodiment of the present invention, steps 710 through 760 of process 700 may further be repeated to accumulate a greater stress effect on semiconductor structures, which may aid in identifying STI corner effects.

In this novel manner, wafers may be non-destructively examined for STI corner thinning in a commercially acceptable manner and time flame. The ability to test large numbers of wafers, and potentially also test multiple areas on a wafer may lead to greater understanding of the STI process, greater quality control, increased reliability of STI semiconductors, greater process yields and more profitable production processes.

FIG. 8 shows two graphs 810 and 820 illustrating plots of experimental results of normalized difference current versus voltage for an edge intensive STI structure, and a substantially planar structure, according to an embodiment of the present invention.

Graphs 810 and 820 are similar to graphs 401–404 of FIG. 4, except that they represent different structures on the same semiconductor wafer. Graph 810 corresponds to a planar structure, for example structure 600 of FIG. 6, and graph 820 corresponds to an edge intensive STI structure, for example structure 500 of FIG. 5.

As described above in regards to FIG. 4A, a voltage sweep was applied to a planar structure, and information was collected to construct an I–V curve. Subsequently, a stress voltage, in this case −9.75 volts, was applied for a period of 20 seconds. Then, a voltage sweep was applied to a planar structure, and another set of information was collected to construct another I–V curve.

Curve 812 shows the difference between the two I–V curves of a planar structure normalized by the firs I–V curve, as a percentage. Curve 815 shows a normalized difference between I–V curves before and after a sixth application of an electrical stress.

Likewise, curve 822 shows the difference between the two I–V curves of an STI edge intensive structure, normalized by the first I–V curve, as a percentage. Curve 825 shows a normalized difference between I–V cures before and after a sixth application of an electrical stress.

The maximum normalized difference for the planar structure is approximately 165%, as shown by point 817. The maximum normalized difference for the STI edge intensive structure is approximately 105%, as shown by point 827 (note the different scales of the "Y" axes). As the normalized difference for the STI edge intensive structure is less than the normalized difference for the planar structure, STI corner thinning is not present and the wafer may be considered acceptable with respect to STI corner effect.

In this novel manner, electric field effects due to stress induced leakage current are compared to determine STI corner thinning effects. Embodiments of the present invention have numerous advantages over the prior art. The tests and test equipment are faster, non-destructive and may be utilized in different portions of every wafer produced. In addition, embodiments of the present invention may generally be practiced on existing, common integrated circuit testers which are usually already available to semiconductor manufacturers.

The preferred embodiment of the present invention a method of detecting shallow trench isolation corner thinning by electrical trapping is thus described. While the present invention has been described in particular embodiments, it should be appreciated that the present invention should not be construed as limited by such embodiments, but rather construed according to the below claims.

What is claimed is:

1. A computer implemented method (700) for testing semiconductors comprising shallow trench isolation edge structures, said method comprising:

a) collecting gate current information for an edge intensive STI structure (500);

b) collecting gate current information for a planar structure (600);

c) applying an electrical stress to said edge intensive STI structure (500) and said planar structure (600); and d) repeating said a) and said b).

2. The method as described in claim 1 further comprising rejecting a wafer comprising said edge intensive STI structure (500) and said planar structure (600) if normalized difference in gate current for said edge intensive STI structure (500) is greater than normalized difference in gate current for said planar structure (600).

3. The method as described in claim 2 wherein said comparison is made at a specific voltage.

4. The method as described in claim 3 wherein said specific voltage is between 70% and 80% of a dielectric breakdown voltage of an oxide layer of said edge intensive STI structure (500).

5. The method as described in claim 1 wherein a voltage applied in said c) is within twenty percent of a dielectric breakdown voltage of an oxide layer of said edge intensive STI structure (500).

6. The method as described in claim 1 further comprising repeating said c) and said d).

7. The method as described in claim 6 wherein said c) is performed six times in total.

8. The method as described in claim 1 wherein said electrical stress is applied for a period of time between 5 and 60 seconds.

9. The method as described in claim 1 further comprising rejecting a wafer comprising said edge intensive STI structure (500) and said planar structure (600) if normalized difference in gate current for said edge intensive STI structure (500) is less than a specific percentage of normalized difference in gate current for said planar structure (600).

10. A method of presenting information of testing semiconductors comprising:

a) collecting gate current information for an edge intensive STI structure (100);

b) applying an electrical stress to said edge intensive STI structure (100);

c) repeating said a) and said b); and d) presenting information gathered in a), and c) as a difference in gate current.

11. The method as described in claim 10 further comprising normalizing said difference in gate current by an initial gate current.

12. The method as described in claim 11 wherein said presenting comprises graphing normalized difference in gate current versus applied voltage.

13. The method as described in claim 12 further comprising a visual graph representing a plot of normalized difference current versus voltage.

14. The method as described in claim 10 further comprising repeating said b) and said c).

15. The method as described in claim 14 further comprising graphing multiple normalized differences in gate current versus applied voltage after multiple electrical stresses to said intensive STI structure (100).

16. The method as described in claim 15 further comprising a visual graph representing a plot of normalized difference current versus voltage.

* * * * *